United States Patent [19]

Gorman

[11] Patent Number: 5,265,328
[45] Date of Patent: Nov. 30, 1993

[54] CIRCUIT MODULE EXTRACTION TOOL AND METHOD

[75] Inventor: Sean Gorman, Seattle, Wash.

[73] Assignee: Stratos Product Development Group, Inc., Seattle, Wash.

[21] Appl. No.: 989,203

[22] Filed: Dec. 11, 1992

[51] Int. Cl.⁵ .......................................... H01R 43/00
[52] U.S. Cl. ...................................... 29/829; 29/278; 29/426.6; 29/762; 29/764
[58] Field of Search .............. 29/764, 762, 758, 278, 29/829, 426.5, 426.6; 294/15, 1.1, 26

[56] References Cited

U.S. PATENT DOCUMENTS

| | | |
|---|---|---|
| 3,181,906 | 5/1965 | DeRose et al. . |
| 3,193,316 | 6/1965 | Custer . |
| 3,443,297 | 5/1969 | Lusby, Jr. . |
| 3,484,129 | 12/1969 | Askren . |
| 3,570,096 | 3/1971 | Sosinski . |
| 3,588,983 | 6/1971 | Hoy . |
| 3,626,575 | 12/1971 | Greenspan . |
| 3,632,036 | 1/1972 | Halstead . |
| 3,720,907 | 3/1973 | Asick . |
| 3,759,559 | 9/1973 | Yuska . |
| 3,786,391 | 1/1974 | Mathauser . |
| 3,797,092 | 3/1974 | Einarson . |
| 3,846,895 | 11/1974 | Cosham et al. . |
| 3,867,753 | 2/1975 | Urban, II et al. . |
| 3,974,556 | 8/1976 | Kubik . |
| 4,022,370 | 5/1977 | Durney . |
| 4,033,032 | 7/1977 | Romania et al. . |
| 4,034,202 | 7/1977 | Vandermark . |
| 4,136,444 | 1/1979 | Durney . |
| 4,141,138 | 2/1979 | Quick . |
| 4,215,468 | 8/1980 | Greco . |
| 4,223,934 | 9/1980 | Cauceglia et al. . |
| 4,377,906 | 5/1983 | Bertellotti et al. . |
| 4,385,438 | 5/1983 | Bertellotti et al. . |
| 4,403,408 | 9/1983 | Koppensteiner et al. . |
| 4,411,064 | 10/1983 | Koppensteiner et al. . |
| 4,453,754 | 6/1984 | Kelly . |
| 4,521,959 | 6/1985 | Sprenkle . |
| 4,583,287 | 4/1986 | McDevitt et al. . |
| 4,597,174 | 7/1986 | Sevigny . |
| 4,604,796 | 8/1986 | Tsipenyuk et al. . |
| 4,619,495 | 10/1986 | Sochor . |
| 4,660,281 | 4/1987 | Omand . |
| 4,666,199 | 5/1987 | Cheh . |
| 4,723,361 | 2/1988 | Carlson et al. . |
| 4,756,078 | 7/1988 | Dougherty et al. . |
| 4,827,607 | 5/1989 | Korsunsky et al. . |
| 4,850,892 | 7/1989 | Clayton et al. . |
| 4,858,309 | 8/1989 | Korsunsky et al. . |
| 4,873,761 | 10/1989 | Korsunsky et al. . |
| 4,882,700 | 11/1989 | Mauritz et al. . |
| 4,891,583 | 1/1990 | Ohta . |
| 4,938,106 | 7/1990 | Roberts . |
| 4,941,700 | 7/1990 | Lin et al. . |
| 4,946,403 | 8/1990 | Billman et al. . |
| 4,978,912 | 12/1990 | Vonder et al. . |
| 4,984,355 | 1/1991 | Lubrano et al. . |
| 4,992,850 | 2/1991 | Corbett et al. . |
| 5,046,237 | 9/1991 | Conforti et al. . |
| 5,062,201 | 11/1991 | Long, Jr. . |
| 5,119,547 | 6/1992 | Ii ........................................ 29/764 |

*Primary Examiner*—Carl E. Hall
*Attorney, Agent, or Firm*—Hughes & Multer

[57] ABSTRACT

A tool for extracting an electronic module from a socket for the electronic module. The socket has first and second retaining projections formed thereon which engage first and second retaining holes in the module to allow movement of the module only in a first direction relative to the socket. The tool basically comprises: (a) a main body portion; (b) a pair of extraction detents extending from the main body portion; and (c) first and second channel portions. The channel portions are arranged to receive outer peripheral edge portions of the module. When the extraction tool is displaced towards the socket with the module edge portions received within the channel portions, the channel portions guide the tool into an extraction position in which extraction projections on the extraction detents are adjacent to the retaining holes. By rotating the tool and module in the first direction, the retaining projections no longer engage the retaining holes and the extraction projections enter the retaining holes. The extraction projections thus engage the retaining holes to allow the module to be removed from the socket.

17 Claims, 4 Drawing Sheets

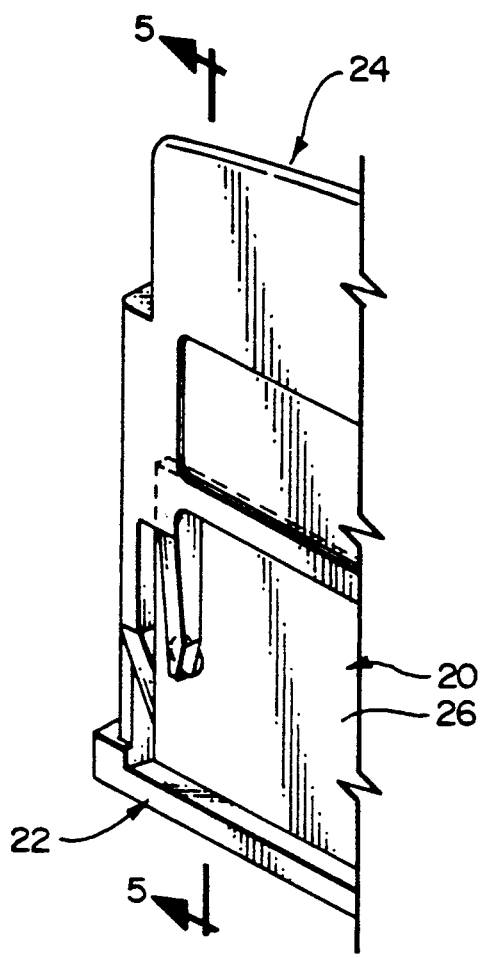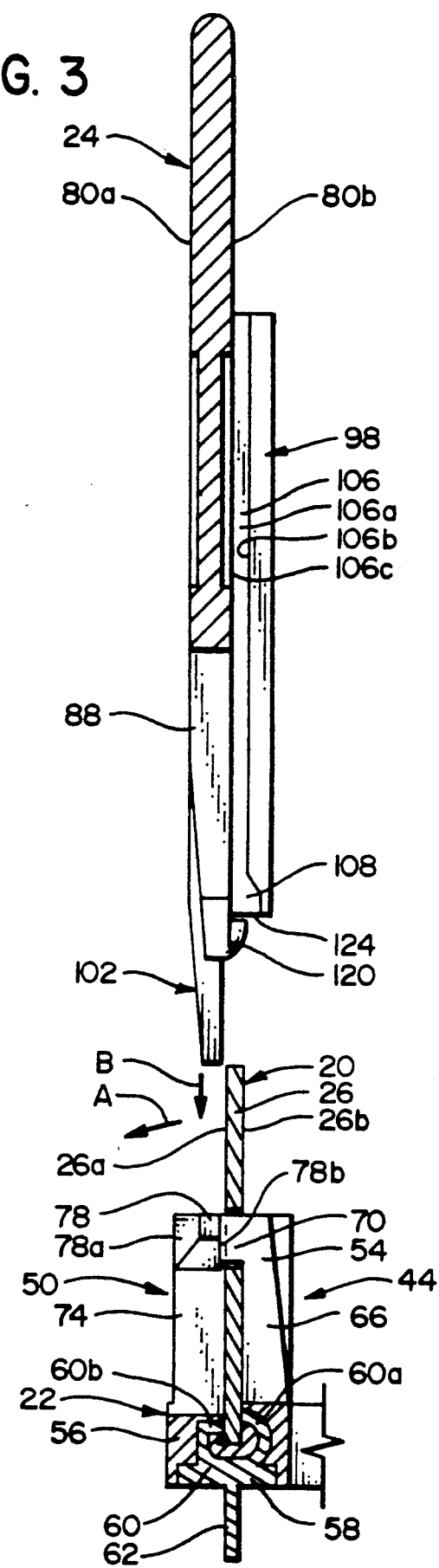

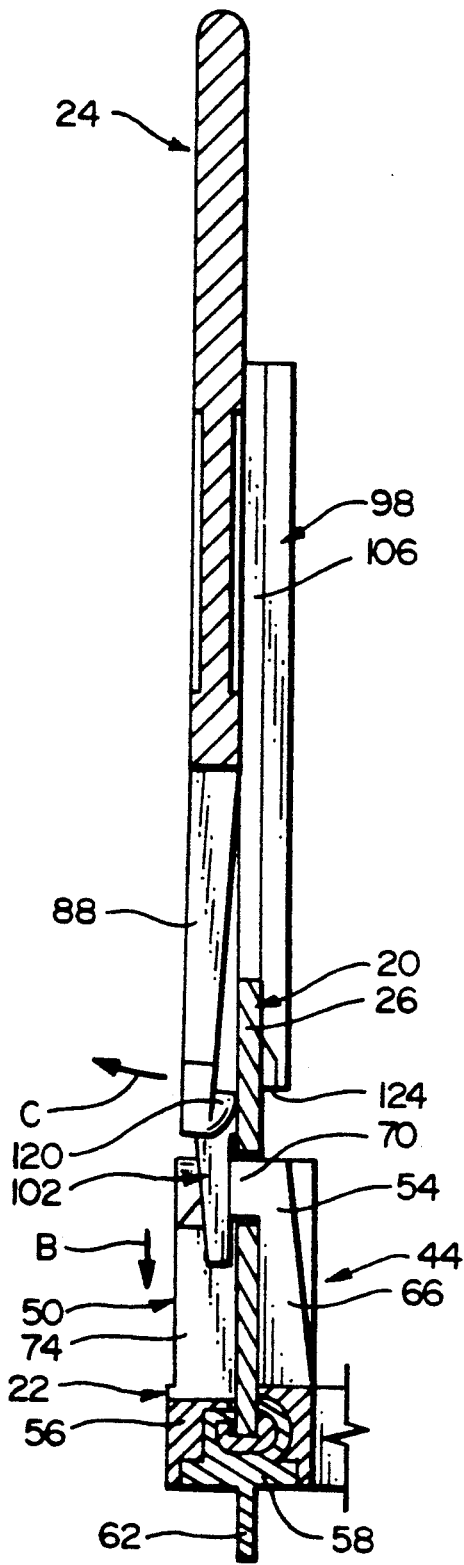
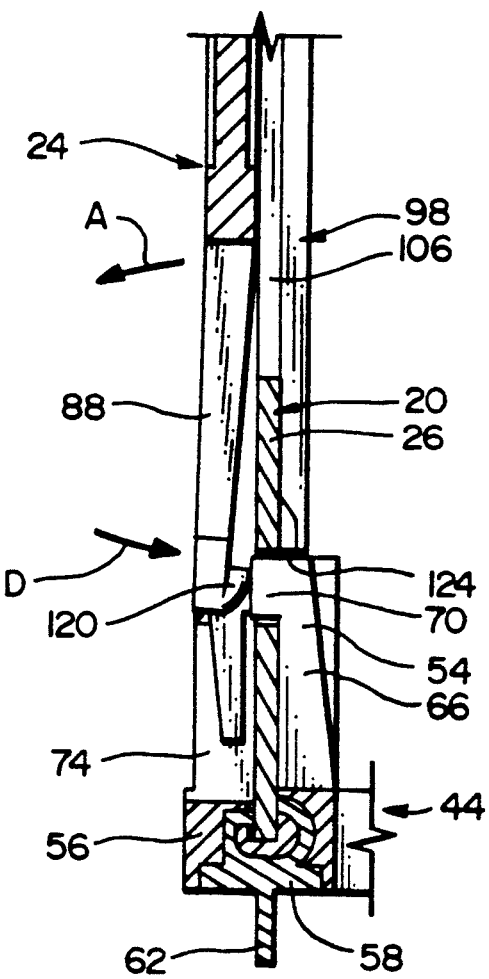
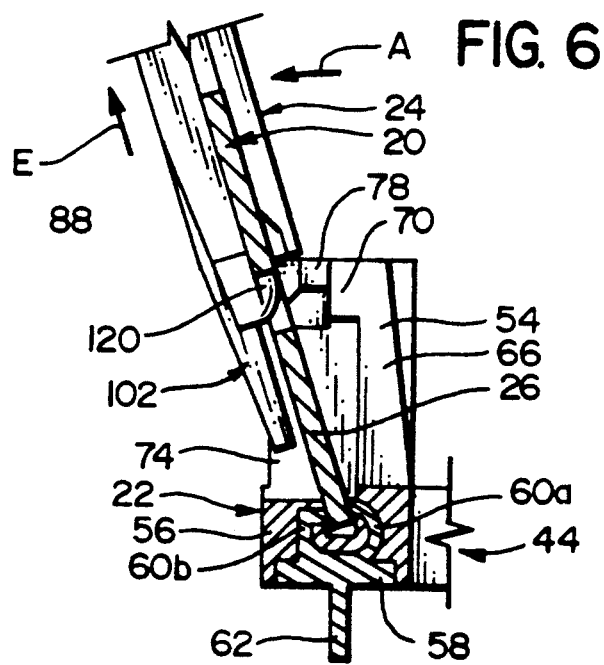

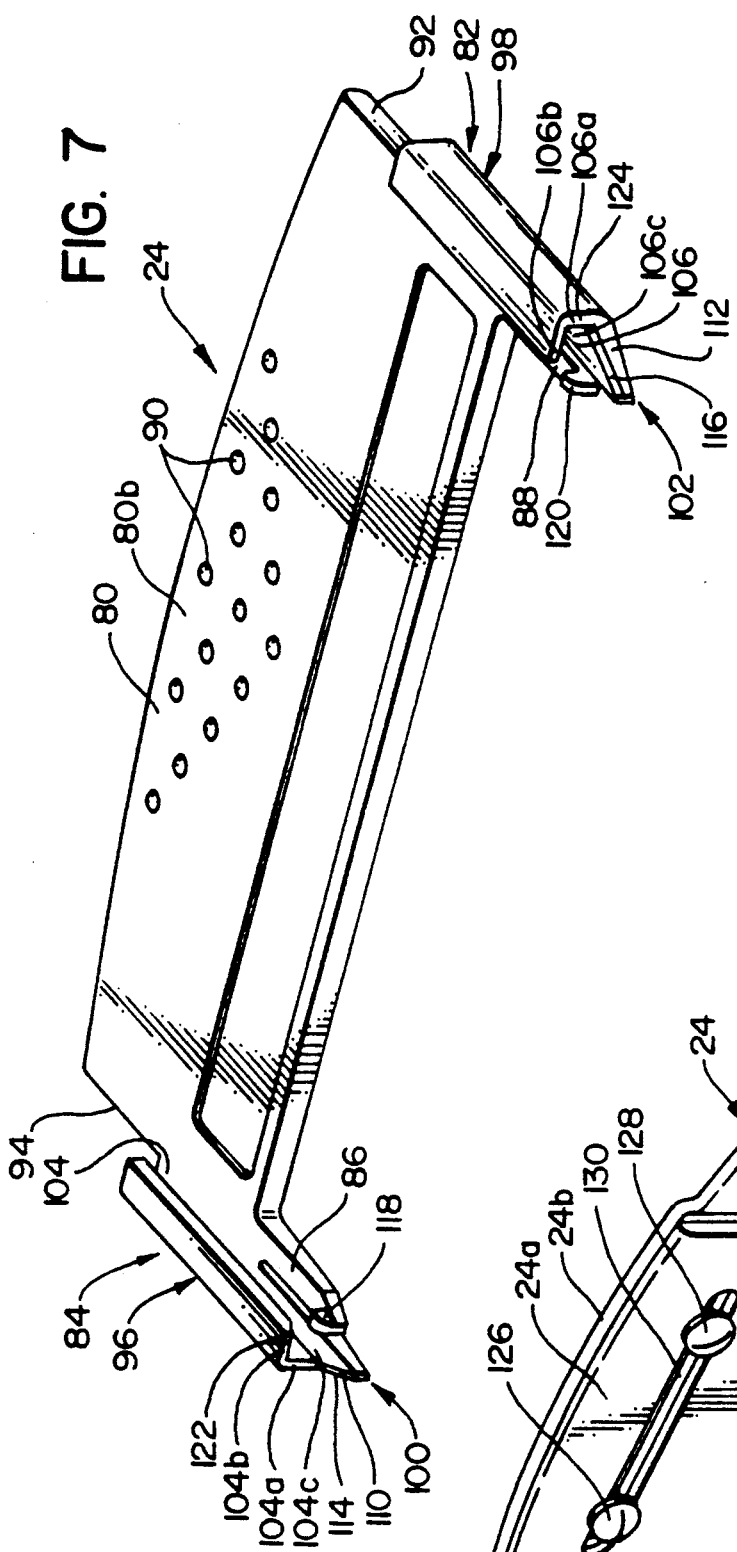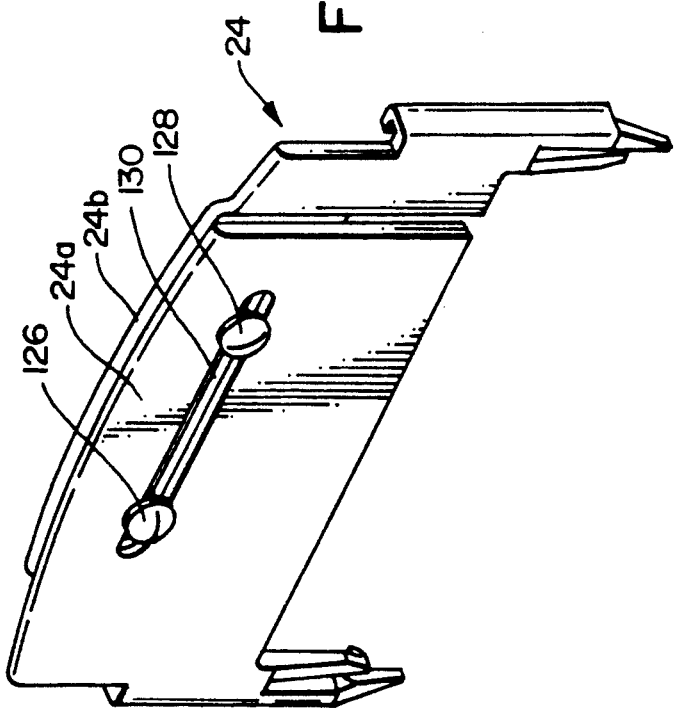

CIRCUIT MODULE EXTRACTION TOOL AND METHOD

TECHNICAL FIELD

The present invention relates to tools for the extraction of circuit modules, and, more specifically, to tools for the extraction of single in-line memory modules.

BACKGROUND OF THE INVENTION

The present invention is particularly useful when employed to extract single in-line memory modules (SIMMs) from sockets therefor. Computer makers have generally adopted SIMMs and SIMM sockets as the standard method of connecting RAM memory to computer motherboards. While the present invention is particularly effective when applied to SIMMs, the principles of the present invention may have application to other types of electronics modules. The scope of the present invention is therefore to be determined by the attached claims and not the following detailed description.

A SIMM is a printed circuit card having a number of RAM integrated circuit chips mounted thereon and terminals that allow these memory chips to be electrically connected to conductive portions of the motherboard. The conductive portions of the motherboard, as well as the mechanical structure for maintaining the SIMM terminals in electrical contact with these conductive portions, are provided by the SIMM socket. The combination of SIMMs and SIMM sockets allows RAM memory to be accessed by circuitry on the motherboard without the need to solder the RAM chips onto the motherboard. Accordingly, when a computer owner desires to increase the RAM memory of a computer system equipped with SIMMs and SIMM sockets, RAM memory may be added to the system without soldering or other complicated processes that may be beyond the technical expertise of the owner.

In order to remove a SIMM from a SIMM socket, latches located on either end of the SIMM socket must be released to allow the SIMM to be rotated out of a mounted position and into a removal position, at which point the SIMM may be removed from the SIMM socket.

The latches mounted on the ends of the SIMM socket should be simultaneously retracted to allow the entire board to rotate into the removal position and thus prevent damage to the SIMM. However, because simultaneous retraction of the end mounted latches is difficult, normally one end mounted latch is retracted, the end of the board associated with that retracted latch is rotated out of the mounted position, the other end mounted latch is retracted, and the remaining portion of the board is rotated into the removal position. This process twists the SIMM and risks damage thereto.

Additionally, the RAM chips are sensitive to static electricity and can be damaged if the person removing the SIMM is not properly grounded.

Finally, due to the cramped space within the housings of many computer systems, it is often necessary to pack SIMMs very tightly together or in inaccessible places. This renders it very difficult for the computer owner to access the latches and remove the SIMM from the socket.

Several tools have been developed to aid in the process of extracting a SIMM from a SIMM socket. U.S. Pat. Nos. 4,858,309 issued 22 Aug. 1989 to Korsunsky et al. and 5,046,237 issued 10 Sep. 1991 to Conforti et al. disclose two such tools. An AUGAT brochure also discloses a tool similar to the devices shown in Korsunsky et al. and and Conforti et al. These tools basically comprise: (a) channels for receiving the edges of the SIMM board; and (b) camming surfaces so formed on the tool that, when the tool is displaced towards the SIMM with the board edges received within the channels, the camming surfaces displace and thus release the latches mounted on the ends of the SIMM socket. Once the end-mounted latches are released, the tool is rotated and the SIMM is removed. These tools are generally made of non-conductive material which substantially alleviates the problem of damage to the RAM chips due to static electricity.

However, these tools rely on the frictional engagement between the edges of the SIMM board and the channels to allow the SIMM to be removed once the SIMM has been rotated into the removal position. In practice, this friction is often insufficient to remove the SIMM from the SIMM socket because the conductive portions of the SIMM socket frictionally engage the electrical contacts on the SIMM with frictional force greater than that between the tool and the SIMM. The tool simply slides off of the SIMM when this occurs. The user is then tempted to grasp the SIMM by hand to remove it, thereby risking static electricity damage to the RAM chips mounted on the SIMM. The friction between the tool and the SIMM board may furthermore damage the surface of the SIMM board.

Another tool for removing SIMMs is shown in an AMP brochure. The tool disclosed in the AMP brochure requires a complex, multi-step process to remove each SIMM. This tool would not be appropriate for use with current SIMMs because it is designed for use with diplomate SIMM sockets (i.e., sockets in which the SIMMs are inserted and removed in a vertical direction).

The following U.S. patents generally relate to tools for removing and extracting circuit modules but do not relate specifically to SIMM module removal tools and thus are less relevant to the present invention than those discussed in detail above: (a) U.S. Pat. No. 3,720,907 issued 12 March 1973 to Asick; (b) U.S. Pat. No. 3,588,983 issued 10 March 1969 to Hoy; (c) U.S. Pat. No. 4,403,408 issued 13 Sept. 1983 to Koppensteiner et al.; (d) U.S. Pat. No. 3,759,559 issued 18 Sept. 1973 to Yuska; (e) U.S. Pat. No. 3,181,906 issued 4 May 1965 to De Rose et al.; (f) U.S. Pat. No. 3,193,316 issued 6 July 1965 to Custer; (g) U.S. Pat. No. 3,443,297 issued 13 May 1969 to Lusby, Jr.; (h) U.S. Pat. No. 3,570,096 issued 16 March 1971 to Sosinski; (i) U.S. Pat. No. 3,484,129 issued 16 Dec. 1969 to Askren; (j) U.S. Pat. No. 3,626,575 issued 14 Dec. 1971 to Greenspan; (k) U.S. Pat. No. 3,632,036 issued 4 Jan. 1972 to Halstead; (l) U.S. Pat. No. 3,786,391 issued 15 Jan. 1974 to Mathauser; (m) U.S. Pat. No. 3,797,092 issued 19 Mar. 1974 to Einarson; (n) U.S. Pat. No. 3,867,753 issued 25 Feb. 1975 to Urban, II et al. (o) U.S. Pat. No. 3,846,895 issued 12 Nov. 1974 to Cosham et al.; (p) U.S. Pat. No. 3,974,556 issued 17 Aug. 1976 to Kubik; (q) U.S. Pat. No. 4,022,370 issued 10 May 1977 to Durney; (r) U.S. Pat. No. 4,034,202 issued 5 July 1977 to Vandermark; (t) U.S. Pat. No. 4,136,444 issued 30 Jan. 1979 to Durney; (u) U.S. Pat. No. 4,141,138 issued 27 Feb. 1979 to Quick; (v) U.S. Pat. No. 4,215,468 issued 5 Aug. 1980 to Greco; (w) U.S. Pat. No. 4,223,934 issued 23 Sept. 1980 to Canceglia et al.; (y) U.S. Pat. No. 4,377,906 issued 29 March 1983 to Bertellotti et al.; (z) U.S. Pat. No. 4,411,064 issued 25 Oct. 1983 to Koppensteiner et al.; (aa) U.S. Pat. No. 4,453,754 issued 12 June 1984 to Kelly; (bb) U.S. Pat. No. 4,521,959 issued 11 June 1985 to Sprenkle; (cc) U.S. Pat. No. 4,385,438 issued 31 May 1983 to Bertellotti et al.; (dd) U.S. Pat. No. 4,583,287 issued 22 April 1986 to McDevitt et al.; (ee) U.S. Pat. No. 4,597,174 issued 1 July 1986 to Sevigny; (ff) U.S. Pat. No. 4,604,796 issued 12 Aug. 1986 to Tsipenyuk et al.; (gg) U.S. Pat. No. 4,660,281 issued 28 April 1987 to Omand; (hh) U.S. Pat. No. 4,619,495 issued 28 Oct. 1986 to Sochor; (ii) U.S. Pat. No. 4,666,199 issued 19 May 1987 to Cheh; (jj) U.S. Pat. No. 4,723,361 issued 9 Feb. 1988 to Carlson et al.; (kk) U.S. Pat. No. 4,756,078 issued 12 July 1988 to Dougherty et al.; (ll) U.S. Pat. No. 4,850,892 issued 25 July 1989 to Clayton et al.; (mm) U.S. Pat. No. 4,827,607 issued 9 May 1989 to Korsunsky et al.; (nn) U.S. Pat. No. 4,873,761 issued 17 Oct. 1989 to Korsunsky et al.; (oo) U.S. Pat. No. 4,938,106 issued 3 July 1990 to Roberts; (pp) U.S. Pat. No. 4,984,355 issued 15 Jan. 1991 to Lubrano et al.; (qq) U.S. Pat. No. 4,946,403 issued 7 Aug. 1990 to Billman et al.; (rr) 4,941,700 issued 17 July 1990 to Lin et al.; (ss) 5,062,201 issued 5 Nov. 1991 to Long, Jr.; (tt) 4,891,583 issued 2 Jan. 1990 to Ohta; (uu) U.S. Pat. No. 4,978,912 issued 18 Dec. 1990 to Vonder et al.; (vv) U.S. Pat. No. 4,882,700 issued 21 Nov. 1989 to Mauritz et al.; and (ww) U.S. Pat. No. 4,992,850 issued 12 Feb. 1991 to Corbett et al.

OBJECTS OF THE INVENTION

In view of the foregoing, it is apparent that an important object of the present invention is to provide an improved tool for removing SIMMs from SIMM sockets.

Another important, but more specific, object of the present invention is to provide a SIMM removal tool having a favorable mix of the following factors:
a. reducing structural damage to SIMMs and SIMM sockets during removal of SIMMs;
b. allowing computer users easily to remove SIMMs from SIMM sockets;
c. maintaining low manufacturing costs; and
d. preventing damage to RAM chips on SIMMs from static electricity.

SUMMARY OF THE INVENTION

These and other objects are achieved by the present invention, which basically comprises an extraction tool having extraction detents which engage retaining holes on a SIMM to allow the module to be removed from a SIMM socket.

Unlike the prior art SIMM removal devices described above, the present invention does not rely on friction between the extraction tool and the SIMM to pull the SIMM from its socket. Instead, the extraction detents positively lock the SIMM to the tool to allow the SIMM to be pulled from its socket.

The extraction detents extend parallel to each other from a main body portion of the extraction tool. Also extending in parallel from the main body portion adjacent to the extraction detents are a pair of side portions. Formed on these side portions are camming surfaces for releasing latches on the SIMM socket. Also formed on these side portions are channels that receive peripheral edge portions of the SIMM and guide the tool relative to the SIMM to allow the camming surfaces to release the latches and the extraction detents to engage the retaining holes.

This structure allows SIMMs to be removed from SIMM sockets without bending the SIMMs, allowing the user's hand to come into contact with the SIMMs, marring the surface of the SIMMS, or damaging the SIMM socket in any way.

BRIEF DESCRIPTION OF THE DRAWING

FIG. 2 depicts the components shown in FIG. 1 joined together immediately prior to extraction of the SIMM from the SIMM socket;

FIGS. 3-6 depict the method of the present invention of employing an extraction tool to remove a SIMM from a SIMM socket;

FIG. 7 is a perspective view showing details of of the extraction tool depicted in FIG. 1;

FIG. 8 is a perspective view showing an adjustable extraction tool constructed in accordance with the principles of the present invention.

DETAILED DESCRIPTION OF THE INVENTION

Figure 1:
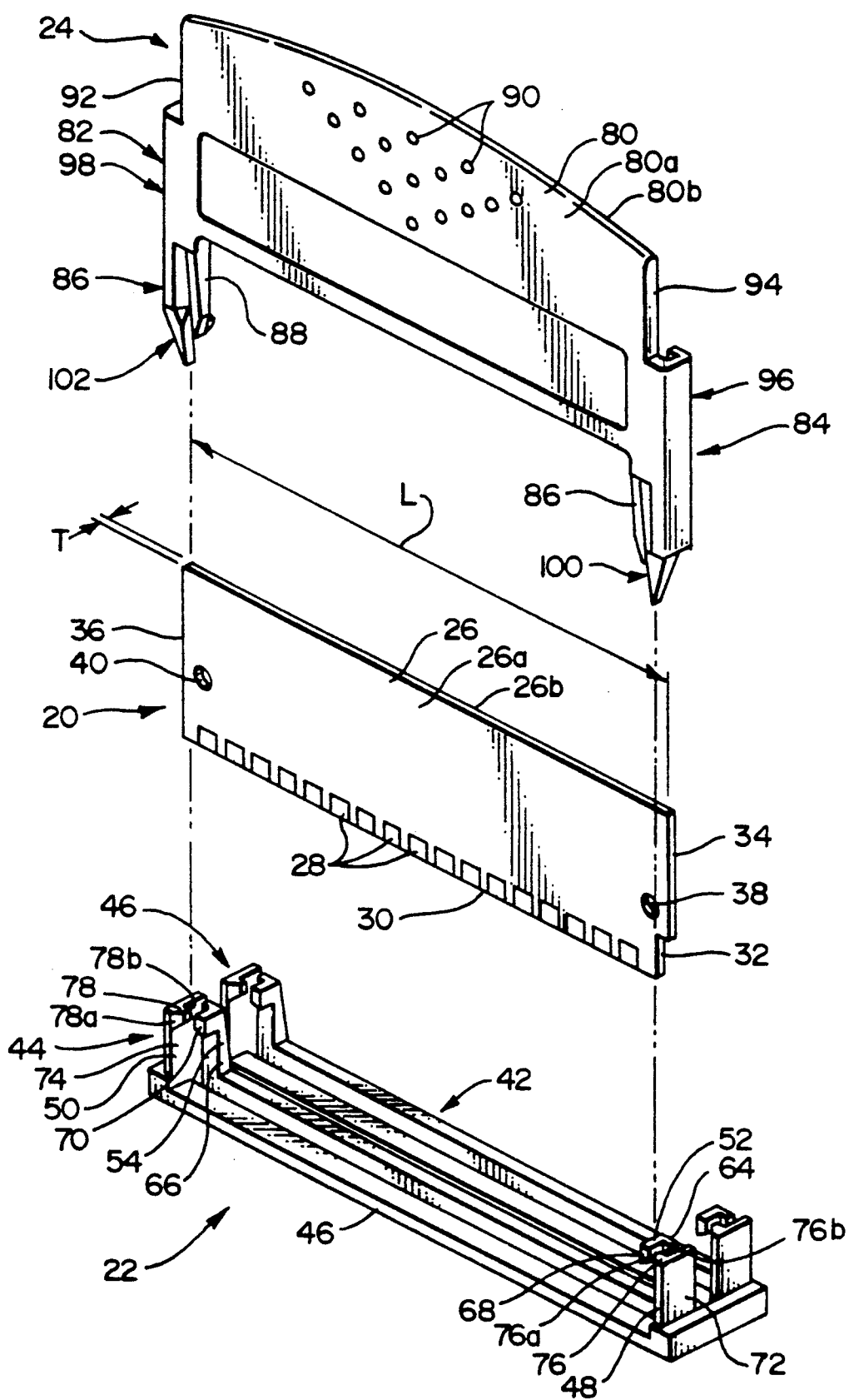
FIG. 1 is an exploded, perspective view of a SIMM, SIMM socket, and an extraction tool constructed in accordance with the principles of the present invention.

Referring now to the drawing, depicted in FIG. 1 is a SIMM 20, a SIMM socket 22, and an exemplary SIMM extraction tool 24 constructed in accordance with, and embodying, the principles of the present invention.

The SIMM 20 and SIMM socket assembly 22 are exemplary of the standard design for such components now in wide use in the computer industry. These components 20 and 22 are generally well-known in the industry and are not in themselves part of the present invention; however, these components 20 and 22 must first be described to provide a complete understanding of the present invention.

The SIMM 20 comprises an essentially rectangular printed circuit board 26 having front and back surfaces 26a and 26b and a number of RAM memory chips (not shown) mounted on this board 26. The board 26 connects the leads of the memory chips to terminals 28 arranged along a bottom edge 30 of the board 26. A keying notch 32 is formed on one of first and second side edges 34 and 36 to require the proper orientation of the board 26 relative to the SIMM socket 32. Retaining holes 38 and 40 are formed adjacent the side edges 34 and 36 for a purpose which will be described in detail below.

The SIMM has a length L between the first and second ends 34 and 36, and the board 26 has a thickness T defined as the distance between the front and back surfaces 26a and 26b.

The SIMM socket assembly 22 basically comprises a mounting portion 42 on which first and second SIMM sockets 44 and 46 are formed. These sockets 44 and 46 are essentially identical and only the socket 44 will be discussed in detail herein.

The SIMM socket 44 basically comprises a base portion 46, first and second latches 48 and 50, and first and second retaining members 52 and 54. As perhaps best shown in FIGS. 3-6, the base portion 46 comprises a plastic body 56 and a plurality of conductive elements 58 mounted within the plastic body 56. Each conductive element 58 is a metal member having a C-shaped upper portion 60 and a pin-like lower portion 62. The lower portions 62 of the elements 58 are inserted into a motherboard (not shown) and electrically connected to circuitry thereon as appropriate. One conductive element 58 is provided for each terminal 28 along the bottom edge 30 of the board 26.

When the SIMM 20 is inserted into the SIMM socket 44 as shown in FIG. 3, the C-shaped upper portions 60 of the conductive elements 58 are so distorted that arms 60a and 60b of the upper portion 60 are biased away from each other. Because they contact the SIMM 20 at different vertical points, the arms 60a and 60b in their biased state apply a small force on the SIMM 20 which tends to rotate the SIMM 20 in the direction shown by arrow A in FIG. 3. (However, as will be discussed in detail shortly, the latches 48 and 50 normally prevent rotation of the SIMM 20 in the direction shown by arrow A.) The force applied by the arms 60a and 60b creates a vapor-free electrical contact between the conductive elements 58 and the terminals 28 associated therewith. A reliable electrical contact is thus maintained between the terminals 28 and the elements 58. The SIMM 20 depicted in FIGS. 3-5 is in what will be referred to herein as the inserted position relative to the SIMM socket 44.

The SIMM 20 is mechanically held onto the SIMM socket 44 by the latches 48 and 50 and the retaining members 52 and 54. More particularly, the retaining members 52 and 54 comprises upwardly directed retaining posts 64 and 66 integrally formed with the socket base portion 46 and retaining projections 68 and 70 extending forwardly from upper ends of the posts 64 and 66 (FIGS. 1 and 3-6). The retaining projections 68 and 70 extend into the retaining holes 38 and 40 when the SIMM 20 is inserted into the SIMM socket 44 as shown in FIG. 3. When the SIMM 20 is so inserted, the retaining projections 64 and 66 engage the retaining holes 38 and 40 and the retaining posts 64 and 66 abut the back surface 20b of the SIMM 20 in a manner that allows the SIMM 20 to move only in the direction indicated by the above-mentioned arrow A.

The latches 48 and 50, as mentioned briefly above, prevent movement of the SIMM in the direction indicated by arrow A. The latches 48 and 50 comprise latch plates 72 and 74 and latch projections 76 and 78. The latch plates 72 and 74 are integrally formed with the socket base portion 46 in a manner that allows them to deflect outwardly a short distance. The latch projections 76 and 78 project inwardly from the latch plates 72 and 74 and have forward-facing backwardly-slanted surfaces 76a and 78a and rear-facing surfaces 76b and 78b formed thereon. The slanted surfaces 76a and 78a engage the SIMM 20 to deflect the latch plates 72 and 74 outwardly during insertion of the SIMM 20. Once the SIMM 20 is inserted, the rear surfaces 76b and 78b contact the forward surface 20a of the SIMM 20 to prevent movement in the direction indicated by arrow A. From the foregoing, it should be clear that, to remove the SIMM 20 from the socket 44, the latch plates 72 and 74 must be deflected outwardly until the surfaces 76b and 78b allow the SIMM 20 to rotate in the direction shown be arrow A.

Referring now to FIGS. 1 and 7, the extraction tool 24 will now be described in further detail. The tool 24 is formed from a single piece of injection molded ABS plastic. This plastic is permanently anti-static and thus does not accumulate or transmit charge from the user to the SIMM being extracted.

The extraction tool 24 basically comprises a main body portion 80, first and second side portions 82 and 84, and first and second extraction detents 86 and 88. The main body portion 80 is slightly shorter than the SIMM 20. Grasping projections 90 are formed in an array on the main body portion 80 to facilitate grasping of the tool 24. The body portion 80 has a front side 80a and a back side 80b.

The side portions 82 and 84 are formed along side edges 92 and 94 of the main body portion 80 and comprise channel defining portions 96 and 98 and camming portions 100 and 102. The channel defining portions 96 and 98 define three-walled channels 104 and 106. Openings of these channels 104 and 106 face each other, with inner walls 104a and 106a of these channels 104 and 106 opposing each other. As is perhaps best shown at reference character 108 in FIG. 3, these openings are slightly wider at their lower lower ends to facilitate insertion and withdrawal of the SIMM board 26, as will be described in detail below.

The distance between the walls 104a and 106a is slightly greater than the length L of the SIMM 20. The distances between the remaining walls 104b,c of the channel 104 and between the walls 106b,c of the channel 106 are slightly greater than the thickness T of the SIMM board 26.

The camming portions 100 and 102 have camming surfaces 110 and 112 and intermediate surfaces 114 and 116 formed thereon. The camming surfaces 110 and 112 are slanted with respect to vertical and generally perpendicular to the rear surface 80b of the main body portion 80. The intermediate surfaces 114 and 116 intersect the camming surfaces 110 and 112, respectively, and are slanted with respect to vertical and the rear surface 80b of the main body portion 80.

The extraction detents 86 and 88 extend from the main body portion 80 parallel to and slightly inside of the side portions 82 and 84. These detents 86 and 88 are integrally formed with the main body portion 80 and can bend slightly rearwardly. Formed on these detents 86 and 88 are extraction projections 118 and 120 which, as best shown in FIG. 3, normally extend slightly forward from the surfaces 104c and 106c of the channels 104 and 106.

Referring now to FIGS. 3-6, the use and operation of the extraction tool 24 will now be described. Initially, the user grasps the main body portion 80 of the tool 24 and arranges the tool so that the extraction detents 86 and 88 are on the front side 26a of the SIMM board 26. The user then brings the tool 24 into contact with the SIMM 20 generally in the direction shown by arrow B in FIG. 3. The tool 24 is then manipulated until the side edges 34 and 36 of the SIMM 20 enter the channels 104 and 106; the increased width of the lower portion of these channels 104 and 106, such as indicated at 108 in FIG. 3, facilitates entry of SIMM 20 into these channels 104 and 106.

The tool 24 is then further displaced in the direction shown by arrow B as shown in FIG. 4. As the tool is displaced towards the socket 44 as shown in FIG. 4, the retraction detents 86 and 88 are displaced slightly forward as shown by the arrow C in FIG. 4; because the material from which the detents 86 and 88 are formed is resilient, these detents 86 and 88 are slightly spring-loaded when they are displaced as shown in FIG. 4.

Additionally, as the SIMM 20 enters the channels 104 and 106, the camming surfaces 112 and 114 act on the latches 48 and 50 to displace the latches outwardly.

Eventually, the latches 48 and 50 are displaced outwardly a sufficient distance so that the latch projections 76 and 78 no longer contact the SIMM board 26 (FIG. 5); at this point, the SIMM may be displaced in the direction indicated by arrow A in FIG. 5. The tool 24 is in what will be referred to as the extraction position when the latches 48 and 50 have been released as just-described.

When the tool 24 is in the extraction position, it has been fully displaced to a point where the extraction projections 118 and 120 are adjacent to the retaining holes 38 and 40 and the retaining projections 68 and 70. Bottom edges 122 and 124 of the channel defining portions 96 and 98 contact the latch plates 72 and 74 to prevent further movement of the tool 24 relative to the socket 44 when the tool 24 is in the extraction position.

As mentioned above, the latches 48 and 50 have been released when the tool 24 is in the retraction position relative to the SIMM 20; additionally, as was mentioned briefly above, the extraction detents 86 and 88 are slightly spring-loaded in the position shown in FIG. 5. Accordingly, as soon as the tool 24 is in the retraction position, the extraction projections 118 and 120 act on the retaining projections 68 and 70 in the direction shown by arrow D in FIG. 5, which causes the SIMM 20 and the tool 24 to rotate slightly relative to the SIMM socket 44 in the direction shown by arrow A. The rotation of the SIMM 20 and tool 24 is about an axis extending substantially through the bottom edge 30 of the SIMM 20. The intermediate surfaces 114 and 116 facilitate this slight rotation caused by the spring-loaded extraction detents 86 and 88 by allowing the tool 26 to move slightly relative to the socket 44.

The tool may then be manipulated to rotate the SIMM 20 out of the inserted position into a removal position as shown in FIG. 6. FIG. 6 also shows that as the SIMM 20 rotates out of the inserted position, the retaining projections 68 and 70 no longer reside within the retaining holes 38 and 40. The resilient retraction detents 86 and 88, which have been spring-loaded, thus move backward until the retraction projections 118 and 120 enter the retaining holes 38 and 40.

With the SIMM 20 in the removal position, the tool 24 may be grasped and displaced in a removal direction shown by arrow E in FIG. 6; the extraction projections 118 and 120 positively engage the retaining holes 38 and 40 to ensure that the SIMM 20 is removed in the direction shown by arrow E in FIG. 6. Any friction between the SIMM 20 and the conductive elements 58 can easily be overcome because the extraction projections 118 and 120 positively engage the retaining holes 38 and 40.

To remove the SIMM 20 from the tool 24, the SIMM 20 is moved until it is at a slight angle relative to the tool, at which point the extraction projections 118 and 120 no longer engage the retaining holes 38 and 40. The SIMM 20 may then easily be slid out of the channels 104 and 106. The enlarged widths of the channel openings such as that shown at 108 in FIG. 3 facilitate the removal of the SIMM from the extraction tool 24.

From the foregoing, it should be clear that the present invention may be embodied in forms other than disclosed above without departing from the spirit or essential characteristics of the present invention. For example, while the above-discussed exemplary tool 24 is designed to accommodate a 30 position SIMM, other SIMMs such as 64 and 72 position SIMMs may easily be accommodated merely by changing the size of the main body portion 80.

Further, one tool that accommodates SIMMs of different lengths L, the size of the tool 24 may be made larger or smaller by dividing the tool 24 into sections 24a and 24b as shown in FIG. 8. Bolts 126 and 128 extending through a groove 130 may be provided to lock the sections 24a and 24b together. The bolt 128 may be loosened and tightened as appropriate to adjust the size of the tool 24 to accommodate SIMMs of various sizes.

Finally, while the above-described tool 24 is designed to engage the retaining holes normally formed in SIMMs, the principles of the extraction detents engaging holes in the module to be extracted may be applied to other holes or grooves in the module.

The above description is therefore to be considered in all respects illustrative and not restrictive, the scope of the invention being indicated by the appended claims rather than the foregoing description. All changes that come within the meaning and scope of the claims are intended to be embraced therein.

I claim:

1. A tool for extracting an electronic module from a socket for the electronic module, the socket having: (a) first and second retaining projections formed thereon which engage first and second retaining holes in the module to allow movement of the module only in a first direction relative to the socket; and (b) first and second releasable retaining latches for selectively preventing movement of the module relative to the socket in the first direction, the tool comprising:
   a. a main body portion;
   b. at least one resilient extraction detent extending from the main body portion;
   c. first and second side portions extending from the main body portion;
   d. first and second camming surfaces formed on the first and second side portions, respectively; and
   e. first and second channel portions formed on the first and second side portions, where the channel portions so receive outer peripheral edges of the module that, when the extraction tool is displaced towards the socket with the module edges received within the channel portions, the channel portions guide the tool into a retraction position and thereby cause:
      i. a projection on the at least one extraction detent to engage the module such that the extraction detent deflects from an original position relative to the first and second side portions in the first direction;
      ii. the first and second camming surfaces to engage and release the first and second latches on the socket to allow the module to be moved in the first direction, and
      iii. the projection on the at least one extraction detent returns to the original position relative to the first and second side portions to enter one of the retaining holes when the module is moved in the first direction.

2. An extraction tool as recited in claim 1, comprising first and second extraction detents extending from the body portion, where the first extraction detent is adjacent to the first retaining hole and the second extraction detent is adjacent to the second retaining hole when the tool is in the extraction position.

3. An extraction tool as recited in claim 1, in which the projection on the at least one extraction detent enters one of the retaining holes as the module is moved into a removal position, where the retaining projections do not engage the retaining holes in the module when the module is in the removal position.

4. An extraction tool as recited in claim 3, in which the projection on the extraction detent engages the retaining hole when the module is in the removal position to prevent relative movement between the tool and the module when the tool is displaced in an extraction direction.

5. An extraction tool as recited in claim 1, in which the projection engages a surface of the module thereby so deflecting the extraction detent before the module is in the removal position that the extraction detent is spring-loaded in a manner that causes the projection to be forced into the retaining hole as the module enters the removal position.

6. An extraction tool as recited in claim 1, in which contact between the channel portions and the peripheral edge portions of the module is substantially frictionless.

7. An extraction tool as recited in claim 1, further comprising at least one stop surface which engages the socket to prevent relative movement of the tool towards the socket when the tool is in the extraction position.

8. An extraction tool as recited in claim 1, in which the projection on the at least one extraction detent enters the retaining hole associated therewith in a direction substantially opposite to the first direction.

9. The extraction tool as recited in claim 1, in whcih the length of the main body portion is extensible to vary the distance between the first and second channel portions.

10. The extraction tool as recited in claim 1, in which the projection on the at least one extraction detent is so aligned relative to the camming surfaces that this projection enters the retaining hole at the point in time when the camming surfaces release the first and second latches on the socket.

11. The extraction tool as recited in claim 10, in which, when the first and second side portions are received in the first and second channel portions, portions of the camming surfaces that are farthest from the socket and the projection on the at least one extraction detent are substantially equidistant from the socket.

12. An extraction tool as recited in claim 10, further comprising at least one stop surface which engages the socket to prevent relative movement of the tool towards the socket when the tool is in the extraction position, the at least one stop surface being so arranged relative to the camming surfaces and the projection on the at least one extraction detent that the stop surface engages the socket at the point in time when the camming surfaces release the first and second latches on the socket and the projection enters the retaining hole.

13. A method of extracting an electronic module from a socket for the electronic module, the socket having: (a) first and second retaining projections formed thereon which engage first and second retaining holes in the module to allow movement of the module only in a first direction relative to the socket; and (b) first and second releasable retaining latches for selectively preventing movement of the module relative to the socket in the first direction, the method comprising the steps of:

a. providing a tool having
  i. a main body portion,
  ii. at least one extraction detent extending from the main body portion,
  iii. first and second side portions extending from the main body portion,
  iv. first and second camming surfaces formed on the first and second side portions, respectively, and
  v. first and second channel portions formed on the first and second side portions;
b. grasping the main body portion of the tool;
c. so displacing the tool relative to the module that the channel portions receive outer peripheral edges of the module and the channel portions guide the the tool relative to the module to cause the first and second camming surfaces to engage and release the first and second latches on the socket to allow the module to be moved in the first direction;
d. displacing the tool to move the module generally in the first direction until the retaining projections on the socket no longer engage the retaining holes and the projection on the at least one extraction detent enters the one of the retaining holes associated therewith; and
e. displacing the tool away from the socket, the projection on the at least one extraction detent so engaging the one of the retaining holes associated therewith that the module is extracted from the socket as the tool is displaced away from the socket.

14. A method as recited in claim 13, in which the step of providing a tool further comprises the step of providing first and second extraction detents extending from the body portion.

15. A method as recited in claim 13, further comprising the step of so arranging the projection on the at least one extraction detent that the projection engages a surface of the module as the tool is displaced relative to the module, thereby so deflecting the extraction detent that the extraction detent is springloaded in a manner that causes the projection to be forced into the retaining hole as the module moves in the first direction.

16. A method tool as recited in claim 13, further comprising the step of providing at least one stop surface on the tool, the stop surface engaging the socket to prevent relative movement of the tool towards the socket when the projection on the at least one extraction detent enters its associated retaining hole.

17. The extraction tool as recited in claim 13, in which the step of providing the tool comprises the step of so forming the projection on the at least one extraction detent that this projection enters the remaining hole at the point in time when the camming surfaces release the first and second latches on the socket.

* * * * *